(12) United States Patent
Ichikawa et al.

(10) Patent No.: US 9,531,157 B2
(45) Date of Patent: Dec. 27, 2016

(54) LIGHTING CIRCUIT AND LAMP SYSTEM

(71) Applicant: KOITO MANUFACTURING CO., LTD., Tokyo (JP)

(72) Inventors: Tomoyuki Ichikawa, Shizuoka (JP); Toshihiko Kurebayashi, Shizuoka (JP)

(73) Assignee: KOITO MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 14/950,881

(22) Filed: Nov. 24, 2015

(65) Prior Publication Data

US 2016/0156152 A1    Jun. 2, 2016

(30) Foreign Application Priority Data

Nov. 27, 2014   (JP) ................. 2014-240408

(51) Int. Cl.

| H01S 5/068 | (2006.01) |
| H01S 5/06 | (2006.01) |
| H05B 37/02 | (2006.01) |
| H05B 33/08 | (2006.01) |

(52) U.S. Cl.
CPC ............ *H01S 5/06825* (2013.01); *H01S 5/06* (2013.01); *H05B 33/0806* (2013.01); *H05B 33/0815* (2013.01); *H05B 33/0818* (2013.01); *H05B 33/0845* (2013.01); *H05B 37/0209* (2013.01)

(58) Field of Classification Search
CPC ............ H05B 33/0806; H05B 33/0815; H05B 33/0818; H05B 33/0827; H05B 33/0839; H05B 33/0887; H05B 37/0254; H05B 37/029

See application file for complete search history.

(56) References Cited

U.S. PATENT DOCUMENTS

| 6,417,624 | B1 * | 7/2002 | Ito ..................... B60Q 1/1415 307/10.8 |
| 6,984,060 | B2 * | 1/2006 | Baba .................... B60Q 1/10 362/37 |
| 8,134,295 | B2 * | 3/2012 | Sasa .................... B60Q 1/085 250/208.1 |

(Continued)

FOREIGN PATENT DOCUMENTS

| JP | 2004-241142 A | 8/2004 |
| WO | 2010070720 A1 | 6/2010 |

*Primary Examiner* — Vibol Tan
(74) *Attorney, Agent, or Firm* — Osha Liang LLP

(57) ABSTRACT

A lighting circuit is configured to turn on or off a semiconductor light source in accordance with a turning-on/off instruction signal. The lighting circuit includes a pulse input determining circuit and a drive circuit. The pulse input determining circuit receives the turning-on/off instruction signal which is in pulse form in commanding turning-on and which is at a constant level in commanding turning-off. The pulse input determining circuit determines whether or not the turning-on/off instruction signal is in a turn-on state in which the turning-on/off instruction signal is in pulse form. The pulse input determining circuit generates a determination signal which is asserted if the turning-on/off instruction signal is in pulse form. The drive circuit supplies the semiconductor light source with a drive current if the determination signal is asserted. The drive circuit does not supply the semiconductor light source with the drive current if the determination signal is negated.

9 Claims, 11 Drawing Sheets

(56) References Cited

U.S. PATENT DOCUMENTS

| | | | |
|---|---|---|---|
| 8,395,321 B2 * | 3/2013 | Tanaka | B60Q 1/0094 |
| | | | 315/80 |
| 9,187,026 B2 * | 11/2015 | Kurebayashi | B60Q 1/04 |
| 9,301,385 B2 * | 3/2016 | Kurebayashi | H05K 1/0204 |
| 2011/0245616 A1 | 10/2011 | Kobayashi | |

* cited by examiner

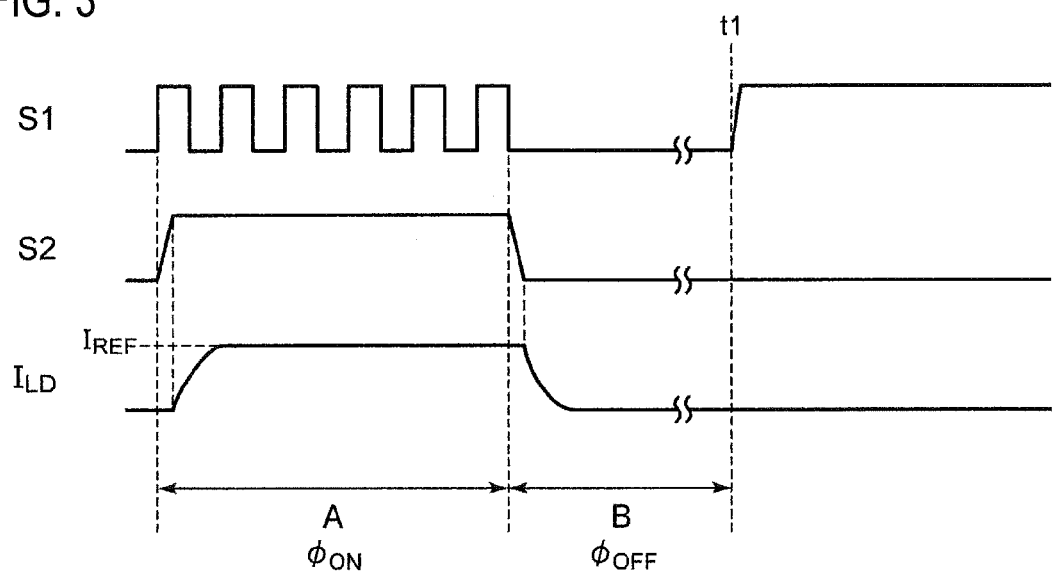

402a

402a

LIGHTING CIRCUIT AND LAMP SYSTEM

CROSS REFERENCE TO RELATED APPLICATION(S)

This application is based on and claims priority under 35 U.S.C. §119 to Japanese Patent Application No. 2014-240408 (filed on Nov. 27, 2014), the entire contents of which are incorporated herein by reference.

BACKGROUND

Technical Field

Exemplary embodiments of the invention relate to a vehicle lamp for use in vehicles, etc.

Related Art

Previously, the mainstream of light sources of vehicle lamps, headlamps in particular, was halogen lamps and HID (high intensity discharge) lamps. However, in recent years, to replace those kinds of lamps, vehicle lamps using a semiconductor light source such as an LED (light-emitting diode) have been developed.

To increase the visibility further, light sources that employ a laser diode (also referred to as a "semiconductor laser") and a phosphor instead of an LED have been developed (see JP 2004-241142 A, for example). In the technique described in JP 2004-241142 A, a phosphor is irradiated with ultraviolet light (excitation light) coming from a laser diode and thereby emits white light forward of the vehicle lamp. Thus, a predetermined light distribution pattern is formed. In the technique described in JP 2004-241142 A, the excitation light is not emitted forward of the vehicle lamp.

Another type of light source is known in which a laser diode generates blue excitation light instead of ultraviolet light. Receiving the blue excitation light, a phosphor emits fluorescent light whose spectrum is in a longer wavelength range (green to red) than the spectrum of the excitation light. The excitation light incident on the phosphor is scattered by the phosphor and loses coherence in passing through the phosphor. The phosphor outputs white light including scattered blue light and green-to-red fluorescent light.

For example, laser light sources are used for generating an additional high beam for illuminating a farther area than a high beam. FIG. 1 is a block diagram of a lamp system 1200 for generating additional high beams. A left lamp (vehicle lamp) 1300L and a right lamp 1300R are configured similarly to each other.

Each vehicle lamp 1300 includes a semiconductor light source (laser diode) 302, a lamp ECU 310, and a lighting circuit 320. The lamp ECU 310 is connected to a vehicle ECU 202 through a bus 203 such as a CAN (controller area network) or an LIN (local interconnect network).

A common power source (not shown) is used as a power source for a high-beam lighting circuit and a power source for the additional high-beam lighting circuit 320. A switch 312 of the lamp ECU 310 is disposed on a supply path of a battery voltage $V_{BAT}$ from a battery 204 to the lighting circuit 320. A CPU (central processing unit) 314 controls the turning-on/off of a high beam and an additional high beam by on/off-controlling the switch 312 based on an instruction, vehicle speed information, etc. supplied from the vehicle ECU 202.

To convey a sense of luxury, it is desirable that the light quantity of an additional light beam increase and decrease gradually with time, which is referred to as "gradual turning-on" and "gradual turning-off." Gradual turning-on can be realized by utilizing a phenomenon that a constant-current converter 322 wakes up gradually when the switch 312 is turned on. On the other hand, as for the gradual turning-off, the output current of the constant-current converter 322 cannot be decreased slowly merely by turning off the switch 312.

Thus, the light circuit 320 includes a gradual turning-on/off circuit 324. The gradual turning-on/off circuit 324 performs gradual turning-on and turning-off by controlling the constant-current converter 322 according to a turning-on/off instruction signal S1 received from the CPU 314.

SUMMARY

For example, assume that the high level and the low level of the turning-on/off instruction signal S1 are assigned to turning-on and turning-off of the semiconductor light source 302, respectively. In this case, if a signal line 304 for transmitting the turning-on/off instruction signal S1 suffers a high-side short-circuiting (i.e., a short-circuiting with a power line), it becomes impossible to control the turning-on/off instruction signal S1 by the CPU 314, which may cause that the semiconductor light source 302 cannot be turned off when it should, to dazzle the drivers of nearby vehicles. Where the manner of logic level assignment is reversed, if the signal line 304 suffers earthing (i.e., a short-circuiting with the ground), the semiconductor light source 302 cannot be turned off when it should.

A disconnection of the signal line 304 may cause a similar problem depending on a way in which the lamp ECU 310 outputs the turning-on/off instruction signal S1 and a way in which the gradual turning-on/off circuit 324 receives the turning-on/off instruction signal S1. These situations may occur irrespective of whether gradual turning-on and turning-off are employed or not. And, these situations are associated with not only an additional high beam but also a high beam and a low beam.

At least one exemplary embodiment of the invention has been made in the above circumstances and provides a lighting circuit that can turn off a semiconductor light source upon occurrence of an abnormality in a signal line that transmits a turning-on/off instruction signal.

(1) According to one exemplary embodiment, a lighting circuit is configured to turn on or off a semiconductor light source in accordance with a turning-on/off instruction signal from a processor. The lighting circuit includes a pulse input determining circuit and a drive circuit. The pulse input determining circuit receives, from the processor, the turning-on/off instruction signal which is in pulse form in commanding turning-on and which is at a constant level in commanding turning-off. The pulse input determining circuit determines as to whether or not the turning-on/off instruction signal is in a turn-on state in which the turning-on/off instruction signal is in pulse form. The pulse input determining circuit generates a determination signal which is asserted if the turning-on/off instruction signal is in pulse form. The drive circuit supplies the semiconductor light source with a drive current if the determination signal is asserted. The drive circuit does not supply the semiconductor light source with the drive current if the determination signal is negated.

If an abnormality such as a disconnection, a high-side short-circuiting, or earthing occurs in a line that transmits the turning-on/off instruction signal, the processor can no longer perform control using the turning-on/off instruction signal. However, in either case, the turning-on/off instruction signal is kept at a constant level. Therefore, with the above configuration, the semiconductor light source can be turned off not only when the processor commands to turn off the semiconductor light source but also when an abnormality occurs. The safety is thus improved.

The expression "the turning-on/off instruction signal is a pulse signal" means not only that the turning-on/off instruction signal alternately transitions between two different potentials but also that the turning-on/off instruction signal alternately transitions between a predetermined potential and a high-impedance state. The expression "the turning-on/off instruction signal is at a constant level" means not only that the turning-on/off instruction signal is kept at a predetermined potential but also that the turning-on/off instruction signal is kept in a high-impedance state.

(2) In the lighting circuit of (1), the pulse input determining circuit may include a capacitor, a charging/discharging circuit, and a determination section. The charging/discharging circuit charges the capacitor (or causes the capacitor to discharge) in response to detection of an edge of the turning-on/off instruction signal. The charging/discharging circuit causes the capacitor to discharge (or charges the capacitor) if no edge of the turning-on/off instruction signal is detected. The determination section determines as to whether the turning-on/off instruction signal indicates turning-on or turning-off, based on a result of a comparison between a voltage of the capacitor and a predetermined threshold voltage.

Where the turning-on/off instruction signal is in pulse form, edges are detected periodically. Therefore, the capacitor is charged (or caused to discharge) periodically and the voltage of the capacitor increases (or decreases). On the other hand, where the turning-on/off instruction signal is kept at a constant level, the capacitor continues to discharge instead of being charged (or caused to discharge) periodically. Therefore, the voltage of the capacitor decreases (or increases). Accordingly, with this configuration, whether the turning-on/off instruction signal is in the turn-on state or the turn-off state can be determined based on the voltage of the capacitor.

(3) In the lighting circuit of (2), the charging/discharging circuit may include an edge detection circuit, a current source, a discharge path, and a comparison transistor. The edge detection circuit detects the edge of the turning-on/off instruction signal. The current source supplies a current to the capacitor in accordance with an output of the edge detection circuit. The capacitor discharges through the discharge path. The comparison transistor receives the voltage of the capacitor at a control terminal thereof.

In the turn-on state, the current source repeatedly charges the capacitor in response to periodic detections of edges. Thereby, the capacitor voltage is increased, and the comparison transistor is turned on. In the turn-off state, the capacitor discharges through the discharge path. Thereby, the capacitor voltage is decreased, and the comparison transistor is turned off. Therefore, whether the turning-on/off instruction signal is in the turn-on state or the turn-off state can be determined in accordance with turning-on and turning-off of the comparison transistor.

(4) The edge detection circuit may include a differentiation circuit that differentiates the turning-on/off instruction signal.

(5) In the lighting circuit of (1), the pulse input determining circuit may include a retriggerable monostable multivibrator that receives, at a trigger input terminal thereof, a trigger signal corresponding to the turning-on/off instruction signal.

When the turning-on/off instruction signal is in the turn-on state, the retriggerable monostable multivibrator is repeatedly triggered by trigger signals corresponding to the turning-on/off instruction signal. Therefore, an output signal of the retriggerable monostable multivibrator is kept unstable. On the other hand, when the turning-on/off instruction signal is in the turn-off state, the output signal of the retriggerable monostable multivibrator is kept stable. Therefore, whether the turning-on/off instruction signal is in the turn-on state or the turn-off state can be determined based on the state of the output signal of the retriggerable monostable multivibrator.

(6) The pulse input determining circuit may further include a low-pass filter that is disposed downstream of the retriggerable monostable multivibrator. In this case, it is possible to decrease the sensitivity of switching from the turn-off state to the turn-on state and to thereby prevent erroneous turning-on.

(7) In the lighting circuit of (1), the pulse input determining circuit may include an edge detection circuit, a non-retriggerable monostable multivibrator, and a low-pass filter. The edge detection circuit detects an edge of the turning-on/off instruction signal. The non-retriggerable monostable multivibrator receives, at a trigger input terminal thereof, a trigger signal corresponding to an output of the edge detection circuit. The low-pass filter is disposed downstream of the non-retriggerable monostable multivibrator.

When the turning-on/off instruction signal is in the turn-off state, the output signal of the non-retriggerable monostable multivibrator is kept stable. On the other hand, when the turning-on/off instruction signal is in the turn-on state, the output signal of the non-retriggerable monostable multivibrator is kept unstable in response to trigger signals. The stable state is restored temporarily after an elapse of time of a certain time constant, and an unstable state is started again by the next trigger signal. In this manner, the output signal of the non-retriggerable monostable multivibrator repeats the stable state and the unstable state. Whether the turning-on/off instruction signal is in the turn-on state or the turn-off state can be determined by providing the low-pass filter downstream of the non-retriggerable monostable multivibrator to remove a short stable state.

(8) The edge detection circuit may include a differentiation circuit that differentiates the turning-on/off instruction signal.

(9) In the lighting circuit of (1), the pulse input determining circuit may include a capacitor, a charging/discharging circuit, and a determination section. The charging/discharging circuit charges the capacitor when the turning-on/off instruction signal is at a first level. The charging/discharging circuit causes the capacitor to discharge when the turning-on/off instruction signal is at a second level. The determination section compares the voltage of the capacitor with the first voltage and the second voltage. The determination section determines as to whether the turning-on/off instruction signal indicates turning-on or turning-off, based on a result of the comparison. A charging rate and a discharge rate are defined so that a voltage of the capacitor is between a first voltage and a second voltage when the turning-on/off instruction signal is in pulse form.

With this configuration, it becomes possible to determine as to whether or not the turning-on/off instruction signal is in pulse form.

(10) The semiconductor light source may include a laser diode and a phosphor. The laser diode emits excitation light. The phosphor is provided on an optical axis of the excitation light. The phosphor is excited by the excitation light to emit fluorescent light. The light source is configured to generate white output light including spectrum of the excitation light and spectrum of the fluorescent light.

In this type of light source, occurrence of an abnormality in the phosphor may cause direct emission of excitation light, which is dangerous. Using the above described lighting circuit in a lamp having this semiconductor light source improves the safety because the emission of excitation light can be stopped reliably even at simultaneous occurrences of an abnormality in the phosphor and a high-side short-circuiting, earthing, a disconnection, or the like in a line.

(11) According to another exemplary embodiment, a lamp system includes a right lamp and a left lamp. Each of the right and left lamps includes a semiconductor light source, a lamp ECU, and a lighting circuit. The lamp ECU generates a turning-on/off instruction signal for commanding turning-on or turning off of the semiconductor light source. The lighting circuit supplies a current to the semiconductor light source. The lighting circuit of the right lamp turns on the semiconductor light source of the right lamp if both of the turning-on/off instruction signal generated by the lamp ECU of the right lamp and the turning-on/off instruction signal generated by the lamp ECU of the left lamp command turning-on. The lighting circuit of the left lamp turns on the semiconductor light source of the left lamp if both of the turning-on/off instruction signal generated by the lamp ECU of the left lamp and the turning-on/off instruction signal generated by the lamp ECU of the right lamp command turning-on.

This configuration can improve the safety because the semiconductor light source can be turned off also at the occurrence of an abnormality.

The certain exemplary embodiments of the invention make it possible to turn off a semiconductor light source upon occurrence of an abnormality in a signal line that transmits a turning-on/off instruction signal.

BRIEF DESCRIPTION OF THE DRAWINGS

FIG. 3 is a waveform diagram showing how the vehicle lamp of FIG. 2 operates;

DETAILED DESCRIPTION

Exemplary embodiments of the invention will be hereinafter described with reference to the accompanying drawings. Same or equivalent constituent elements shown in the figures are given the same respective reference symbols, and redundant descriptions will be avoided as appropriate. The exemplary embodiments are just examples and should not be construed as restricting the invention. All features described in the exemplary embodiments and their combinations are not necessarily essential to the invention.

In this specification, a state in which an element A and an element B are connected to each other includes not only a state in which they are connected to each other directly and physically but also a state in which they are connected to each other indirectly via an element that has no substantial influence on the their electrical connection state or does not impair a function or effect realized by their connection.

Likewise, a state in which an element C is disposed (or provided) between an element A and an element B includes not only a state in which the element A and the element C or the element B and the element C are connected to each other directly but also a state in which they are connected to each other indirectly via an element that has no substantial influence on the their electrical connection state or does not impair a function or effect realized by their connection.

In this specification, symbols that denote voltage signals, current signals, etc. and symbols that denote circuit elements such as resistors and capacitors may represent voltage values, current values, resistance values, capacitance values, etc., when necessary.

First Exemplary Embodiment

Figure 1:
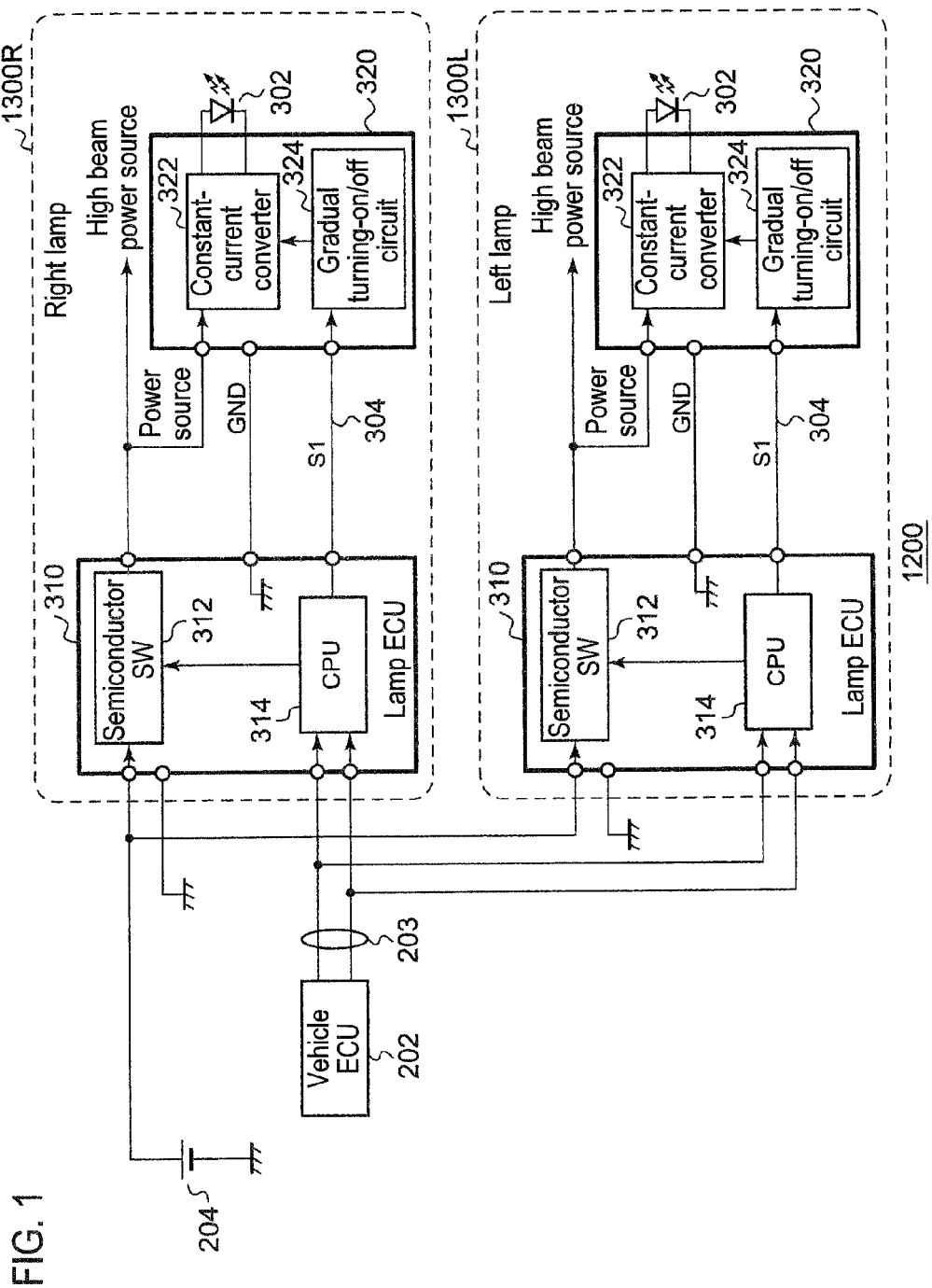
FIG. 1 is a block diagram of a lamp system that generates additional high beams.
Figure 2:
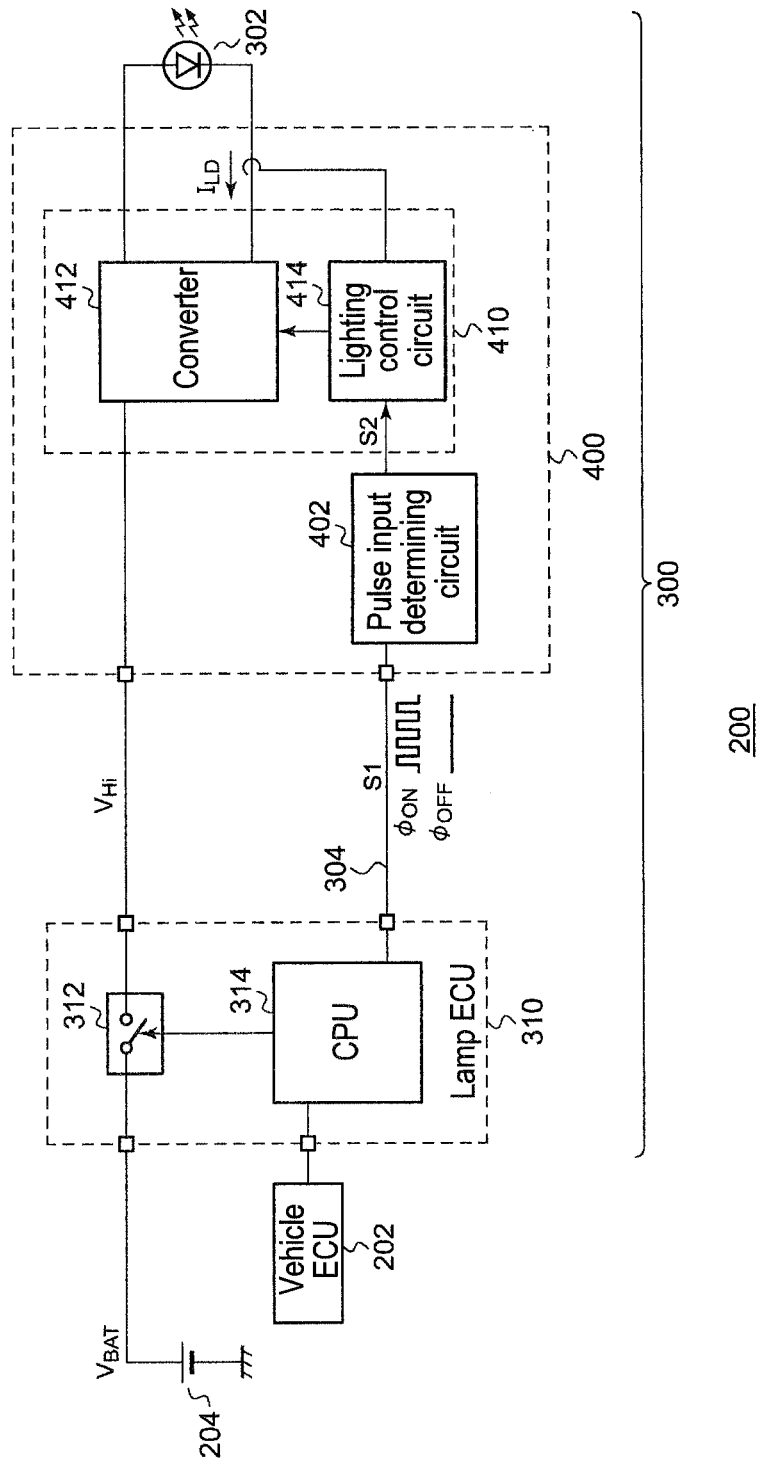
FIG. 2 is a block diagram of a vehicle lamp that includes a lighting circuit according to a first exemplary embodiment.

FIG. 2 is a block diagram of a vehicle lamp 300 which includes a lighting circuit 400 according to a first exemplary embodiment. As in the case of FIG. 1, the vehicle lamp 300 may be a vehicle lamp that generates any of an additional high beam, an ordinary high beam, or a low beam. FIG. 2 shows a lighting system 200 as a whole.

The vehicle lamp 300 includes a semiconductor light source 302, a lamp ECU 310, and a lighting circuit 400. The lighting circuit 400 turns on or off the semiconductor light source 302 in accordance with a turning-on/off instruction signal S1 from a processor (CPU) 314. The semiconductor light source 302 is, for example, a laser diode.

In the first exemplary embodiment, the turning-on/off instruction signal S1 which is generated by the CPU 314 is in pulse form in a turn-on state $\phi_{ON}$ to command turning-on. Also, the turning-on/off instruction signal S1 is at a constant level (i.e., in a steady state) in a turn-off state $\phi_{OFF}$ to command turning-off. The turn-on state $\phi_{ON}$ may be a state in which the turning-on/off instruction signal S1 alternately transitions between two different potentials (e.g., a high level and a low level, a high level and an intermediate level, or an intermediate level and a low level). Alternatively, the turn-on state $\phi_{ON}$ may be a state in which the turning-on/off instruction signal S1 alternately transitions between a predetermined potential (a high level, low level, or intermediate level) and a high-impedance state. Also, the turn-off state $\phi_{OFF}$ may be a state in which the turning-on/off instruction signal S1 continues to have a predetermined potential (a high level, low level, or intermediate level). Alternatively, the turn-off state $\phi_{OFF}$ may be a state in which the turning-on/off instruction signal S1 continues to be in a high-impedance state.

In the first exemplary embodiment, it is assumed that in the turn-on state $\phi_{ON}$, the turning-on/off instruction signal S1 alternately takes a high level (e.g., power source voltage $V_{DD}$) and a low level (ground voltage $V_{GND}$) with a predetermined cycle, and that in the turn-off state $\phi_{OFF}$, the level of the turning-on/off instruction signal S1 is fixed at the low level (ground voltage $V_{GND}$).

The lighting circuit 400 includes a pulse input determining circuit 402 and a drive circuit 410. The pulse input determining circuit 402 receives the turning-on/off instruction signal S1 and determines as to whether or not the turning-on/off instruction signal S1 is in the turn-on state $\phi_{ON}$ in which the turning-on/off instruction signal S1 is in pulse form. If the turning-on/off instruction signal S1 is in the turn-on state $\phi_{ON}$, the pulse input determining circuit 402 asserts a determination signal S2.

When the determination signal S2 is asserted (e.g., the determination signal S2 is at a high level), the drive circuit 410 supplies a drive current $I_{LD}$ to the semiconductor light source 302. Also, when the determination signal S2 is negated (e.g., the determination signal S2 is at a low level), the drive circuit 410 does not supply the drive current $I_{LD}$ to the semiconductor light source 302.

The drive circuit 410 includes, for example, a converter 412 and a lighting control circuit 414. The converter 412 includes a switching converter (DC-DC converter) that receives a power source voltage $V_{Hi}$ which is supplied through the switch 312 and boosts or lowers the power source voltage $V_{Hi}$. There are no limitations on the topology of the converter 412. A proper topology may be selected in accordance with the type, the number of constituent elements, etc. of the semiconductor light source 302.

The lighting control circuit 414 detects the current $I_{LD}$ flowing through the semiconductor light source 302 and controls the converter 412 so that the current $I_{LD}$ matches a reference value $I_{REF}$ corresponding to a target light quantity of the semiconductor light source 302. There are no limitations on the type of the lighting control circuit 414. The lighting control circuit 414 may be any of a pulse width modulation type controller, a pulse frequency modulation type controller, a hysteresis control type controller, etc. A lighting control circuit 414 having a gradual turning-on function may be implemented by increasing the reference value $I_{REF}$ slowly from a time at which it is started to assert the determination signal S2. A lighting control circuit 414 having a gradual turning-off function may be implemented by decreasing the reference value $I_{REF}$ slowly from a time at which it is started to negate the determination signal S2.

Description on the basic configuration of the vehicle lamp 300 has been completed. Then, how the vehicle lamp 300 operates will be described below.

FIG. 3 is a waveform diagram illustrating how the vehicle lamp 300 of FIG. 2 operates. Before time t1, the signal line 304 is in a normal state and the turning-on/off instruction signal S1 is transmitted correctly. In interval A, to turn on the semiconductor light source 302, the CPU 314 generates a pulse turning-on/off instruction signal S1. Since the signal line 304 is in the normal state, the pulse input determining circuit 402 receives the pulse input signal and hence generates an asserted determination signal S2. Being triggered by a start of assertion of the determination signal S2, the lighting control circuit 414 slowly increases the drive current $I_{LD}$, which is supplied to the semiconductor light source 302, to cause gradual turning-on. Then, the lighting control circuit 414 stabilizes the drive current $I_{LD}$ at the target value $I_{REF}$ and thereby keeps the light quantity of the semiconductor light source 302 constant.

In interval B, to turn off the semiconductor light source 302, the CPU 314 generates a low-level turning-on/off instruction signal S1. Since no pulses appear at the input of the pulse input determining circuit 402, the pulse input determining circuit 402 generates a negated determination signal S2. Being triggered by a start of negation of the determination signal S2, the lighting control circuit 414 slowly decreases the drive current $I_{LD}$, which is supplied to the semiconductor light source 302, to cause gradual turning-off.

Assume that the signal line 304 suffers a high-side short-circuiting at time t1. Upon the high-side short-circuiting of the signal line 304, the turning-on/off instruction signal S1 is fixed at the high-level voltage. Since no pulses appear at the input terminal of the pulse input determining circuit 402, the determination signal S2 is kept negated. Therefore, the semiconductor light source 302 is supplied with no drive current $I_{LD}$ and hence is kept off.

As described above, the lighting circuit 400 according to the first exemplary embodiment is improved in safety because the semiconductor light source 302 is turned off not only when its turning-off is commanded by the processor 314 but also when an abnormality such as a high-side short-circuiting, earthing, or a disconnection has occurred.

The invention can be implemented by various kinds of circuits that conform to the block diagram of FIG. 2 and the above description. Specific examples of such circuits will be described below.

Figure 4A:
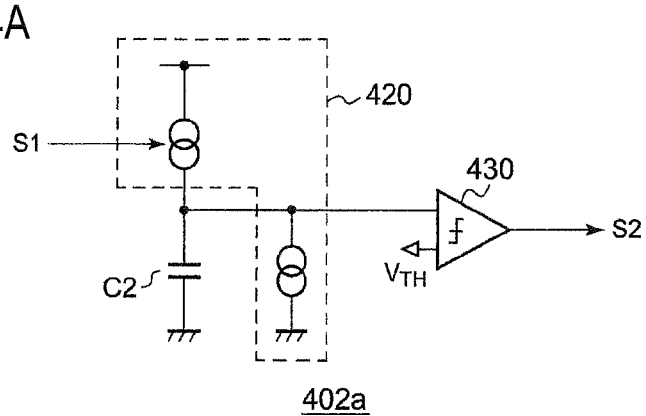
FIGS. 4A and 4B are circuit diagrams of a pulse input determining circuit of a first example.
Figure 4B:
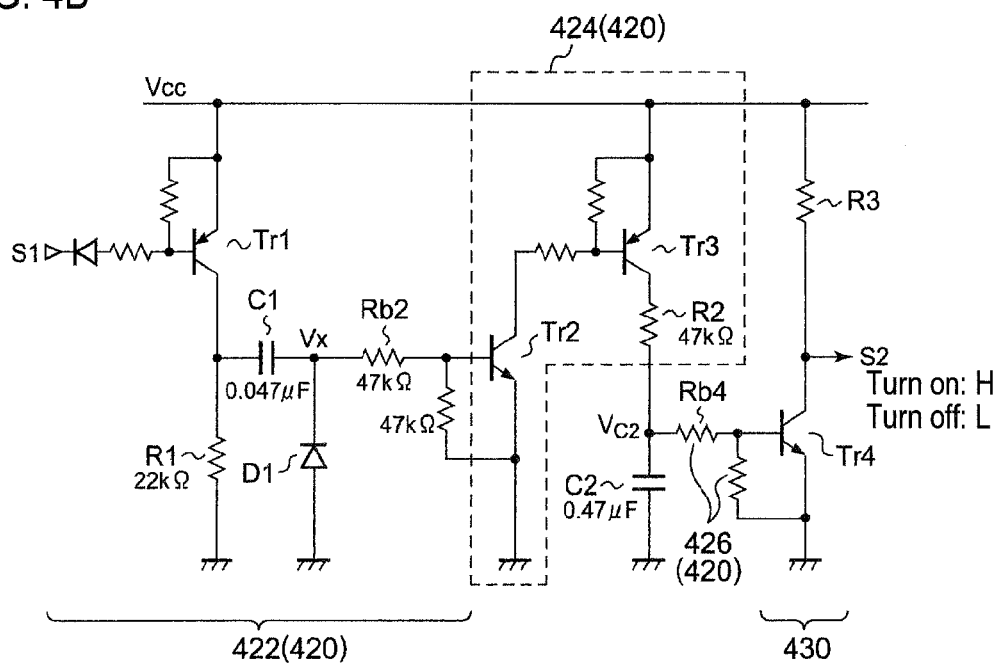

FIGS. 4A and 4B are circuit diagrams of a pulse input determining circuit 402a of a first example. As shown in FIG. 4A, the pulse input determining circuit 402a includes a charging/discharging circuit 420, a capacitor C2, and a determination section 430. A potential at one end of the capacitor C2 is fixed. The charging/discharging circuit 420 charges the capacitor C2 in response to detection of an edge of the turning-on/off instruction signal S1. If no edges are detected, the charging/discharging circuit 420 causes the capacitor C2 to discharge. The charging operation and the discharging operation of the charging/discharging circuit 420 may be replaced with each other. The determination section 430 generates a determination signal S2 in accordance with a result of comparison between a voltage $V_{C2}$ of the capacitor C2 and a predetermined threshold voltage $V_{TH}$.

FIG. 4B more specifically shows the configuration of the pulse input determining circuit 402a than the one shown in FIG. 4A. In this example, the assertion (turn-on) level and the negation (turn-off) of the determination signal S2 are a low level and a high level, respectively. The charging/discharging circuit 420 includes an edge detection circuit 422, a current source 424, and a discharge path 426. The edge detection circuit 422 detects a positive edge of the turning-on/off instruction signal S1. For example, the edge detection circuit 422 may be configured by using a differentiation circuit (high-pass filter). More specifically, the edge detection circuit 422 includes a transistor Tr1, a resistor R1, a capacitor C1, a diode D1, and a resistor Rb2. The series connection of the capacitor C1 and the resistor Rb2 makes up the differentiation circuit. The diode D1 serves as a clamper for preventing swing to a negative voltage due to a negative edge of the turning-on/off instruction signal S1.

The current source 424 includes transistors Tr2, Tr3 and a resistor R2. When a positive edge of the turning-on/off instruction signal S1 is detected, currents flow through the transistors Tr2, Tr3, and a current is supplied to the capacitor C2. When a pulse turning-on/off instruction signal S1 is input and positive edges are detected at predetermined intervals, the capacitor C2 is charged repeatedly by the current source 424.

The discharge path 426 includes a resistor Rb4. The capacitor C2 discharges through the resistor Rb4. A charging current of the current source 424 is set to be larger than the discharge current flowing through the discharge path 426.

The determination section 430 includes a transistor Tr4 and a resistor R3. The voltage $V_{C2}$ of the capacitor C2 is divided by a voltage division circuit which the discharge path 426 makes up, and a divisional voltage is input to the base of the transistor Tr4. When the base-emitter voltage of the transistor Tr4 becomes higher than its threshold value (forward voltage Vbe≈0.6 V), the transistor Tr4 is turned on and the determination signal S2 takes a low level (asserted).

Figure 5A:
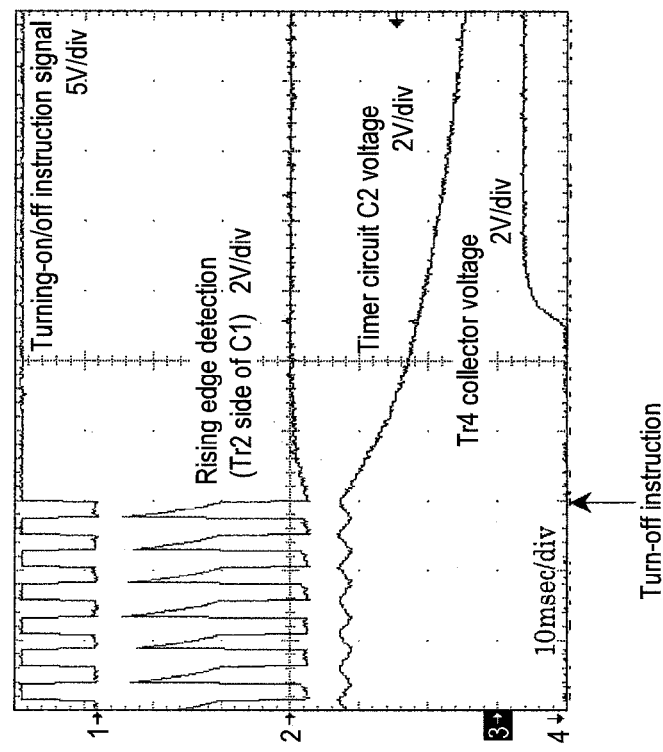
FIGS. 5A and 5B are waveform diagrams showing how the pulse input determining circuit of FIG. 4B operates.
Figure 5B:
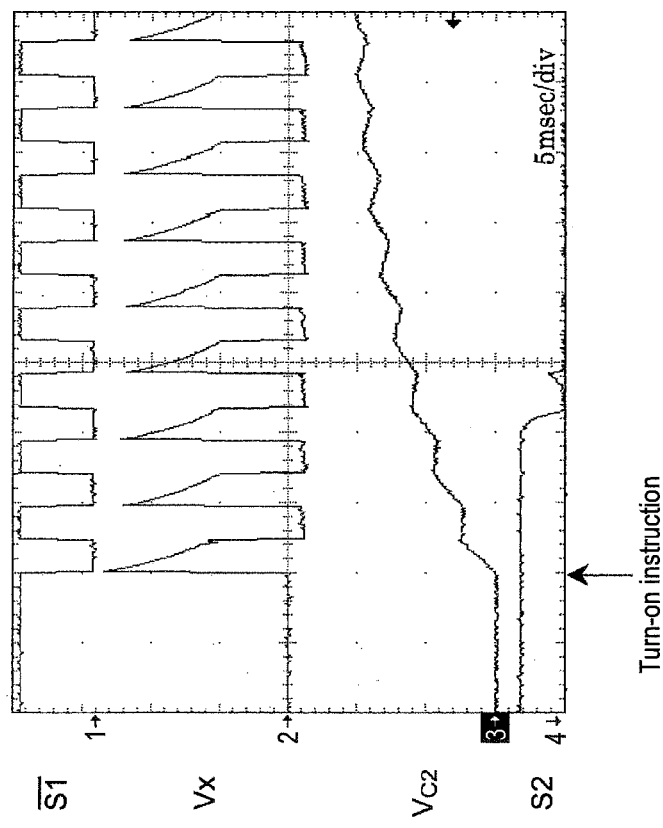

FIGS. 5A and 5B are waveform diagrams showing how the pulse input determining circuit 402a of FIG. 4B operates. A potential of the connection node between the capacitor C1 and the resistor Rb2 is represented by Vx. FIG. 5A shows waveforms that occur at the time of commanding of turning-on. FIG. 5B shows waveforms that occur at the time of commanding of turning-off. Attention should be paid to the fact that FIGS. 5A and 5B are different from each other in the time scale of the horizontal axis.

As described above, the pulse input determining circuit 402a of FIG. 4B can determine as to whether or not the turning-on/off instruction signal S1 in pulse form is being input.

Figure 6:
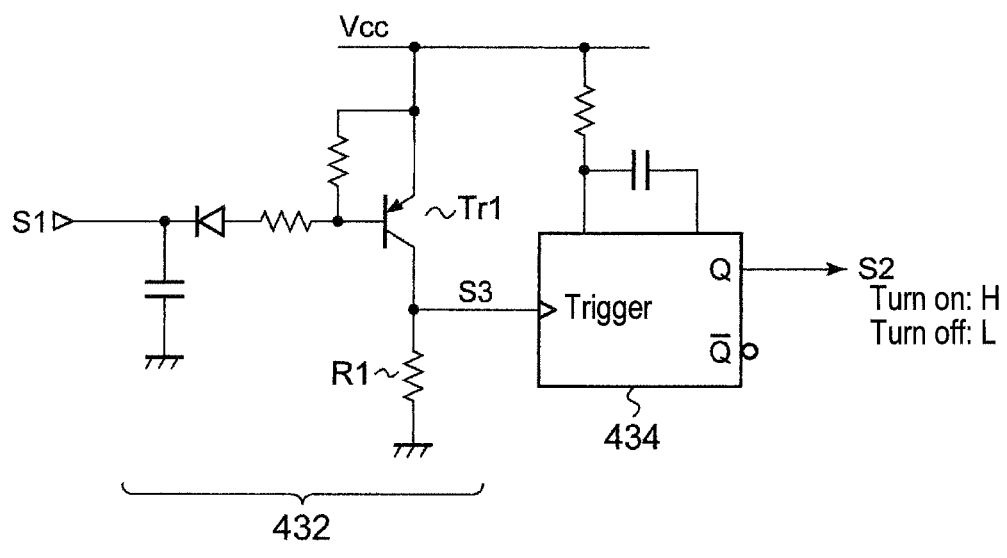
FIG. 6 is a circuit diagram of a pulse input determining circuit of a second example.

FIG. 6 is a circuit diagram of a pulse input determining circuit 402b of a second example. The pulse input determining circuit 402b includes an input circuit 432 and a retriggerable monostable multivibrator 434. The input circuit 432 is an inverting circuit including a transistor Tr1 and a resistor R1. The input circuit 432 generates a trigger signal S3 (inverted logic) corresponding to the turning-on/off instruction signal S1. The monostable multivibrator 434 receives the trigger signal S3 at a trigger input terminal thereof. An oscillation cycle of the monostable multivibrator 434 is set to be longer than the cycle of the turning-on/off instruction signal S1 in pulse form.

When the turning-on/off instruction signal S1 is in a turn-on state $\phi_{ON}$ in which the turning-on/off instruction signal S1 is in pulse form, the monostable multivibrator 434 is triggered repeatedly by the trigger signal S3 which corresponds to the turning-on/off instruction signal S1. Therefore, an output terminal Q of the monostable multivibrator 434 continues to output an unstable signal. Conversely, when the turning-on/off instruction signal S1 is in the turn-off state $\phi_{OFF}$, the output terminal Q of the monostable multivibrator 434 continues to output a stable signal. Therefore, whether the turning-on/off instruction signal S1 is in the turn-on state $\phi_{ON}$ or the turn-off state $\phi_{OFF}$ can be determined using the output signal of the output terminal Q of the monostable multivibrator 434 as the determination signal S2.

In the pulse input determining circuit 402a of FIGS. 4A and 4B, when the duty ratio (pulse width) of the turning-on/off instruction signal S1 becomes large (or small), the differentiation signal Vx is made short. As a result, the charging current may become not enough, and the pulse input determining circuit 402a may negate the determination signal S2 even though a pulse signal is being input. The pulse input determining circuit 402b of FIG. 6 can detect a pulse signal irrespective of a duty ratio and pulse width of the turning-on/off instruction signal S1.

The pulse input determining circuit 402b of FIG. 6 offers such an advantage that it is possible to change the duty ratio and/or pulse width of the turning-on/off instruction signal S1 freely. Therefore, information indicating a light quantity may be added to the turning-on/off instruction signal S1 by pulse-width-modulating the turning-on/off instruction signal S1 based on a target light quantity of the semiconductor light source 302. In this case, since a turning-on/off instruction signal S1 having a 100% duty ratio is a DC signal to command the turn-off state, the light quantity is controlled using a duty ratio that is smaller than 100% as an upper limit without using the 100% duty ratio. The lighting circuit 400 is added with a circuit that detects a duty ratio of the turning-on/off instruction signal S1, separately from the pulse input determining circuit 402b. Alternatively, information indicating a light quantity may be added to the turning-on/off instruction signal S1 by pulse-frequency-modulating the turning-on/off instruction signal S1 based on the target light quantity of the semiconductor light source 302.

A low-pass filter (not shown) may be further provided downstream of the monostable multivibrator 434. This makes it possible to reduce the sensitivity to switching from the turn-off state to the turn-on state and thereby prevent erroneous turning-on.

Figure 7:
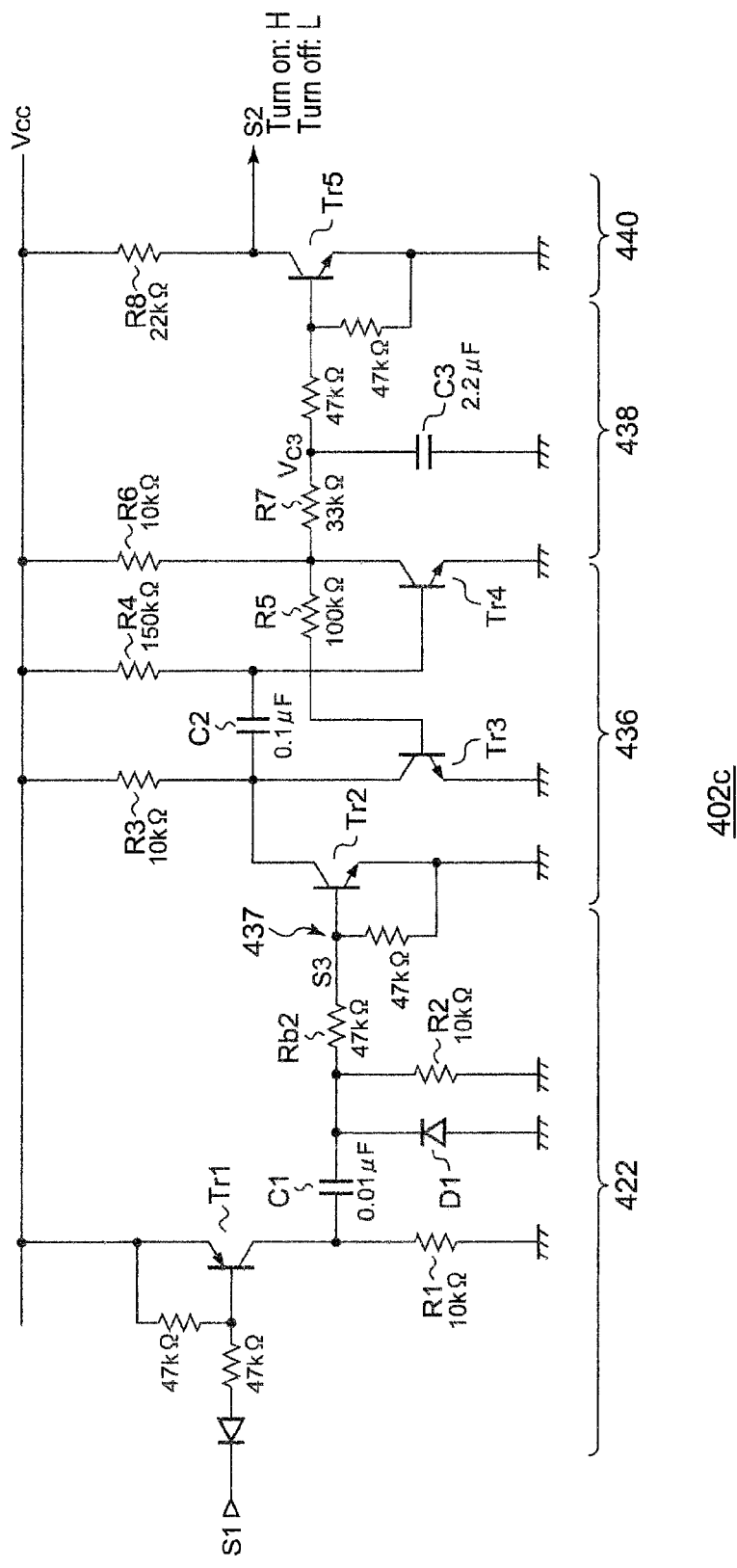
FIG. 7 is a circuit diagram of a pulse input determining circuit of a third example.

FIG. 7 is a circuit diagram of a pulse input determining circuit 402c of a third example. The retriggerable monostable multivibrator 434 used in FIG. 6 is complex in circuit configuration and hence needs to be implemented by a dedicated IC, which would result in cost increase. The pulse input determining circuit 402c of FIG. 7 employs a non-retriggerable monostable multivibrator 436 which can be configured using a small number of elements.

The pulse input determining circuit 402c includes an edge detection circuit 422, the monostable multivibrator 436, a low-pass filter 438, and an output circuit 440. The edge detection circuit 422 detects a positive edge of the turning-on/off instruction signal S1. The edge detection circuit 422 is similar in configuration to that shown in FIG. 4B.

The monostable multivibrator 436 receives, at a trigger input 437 thereof, a trigger signal S3 corresponding to an output signal of the edge detection circuit 422. The low-pass filter 438 is provided downstream of the monostable multivibrator 436. The output circuit 440 binarizes an output signal of the low-pass filter 438 and outputs a resulting signal.

Figure 8A:
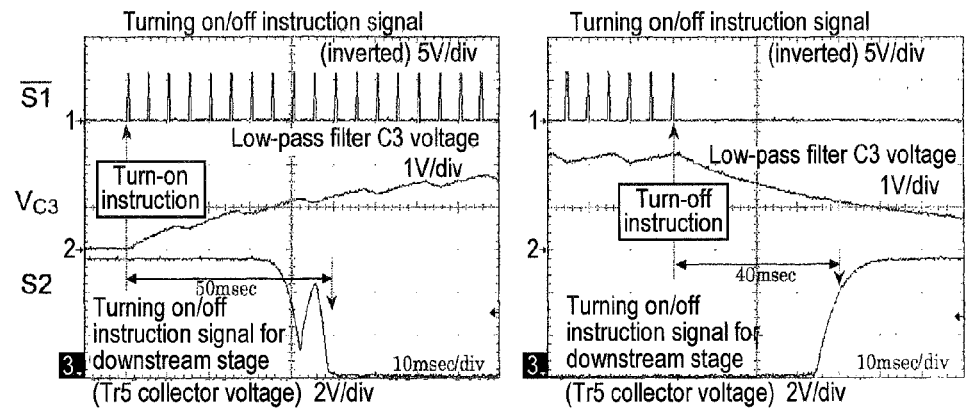
FIGS. 8A to 8C are waveform diagrams showing how the pulse input determining circuit of FIG. 7 operates.
Figure 8B:
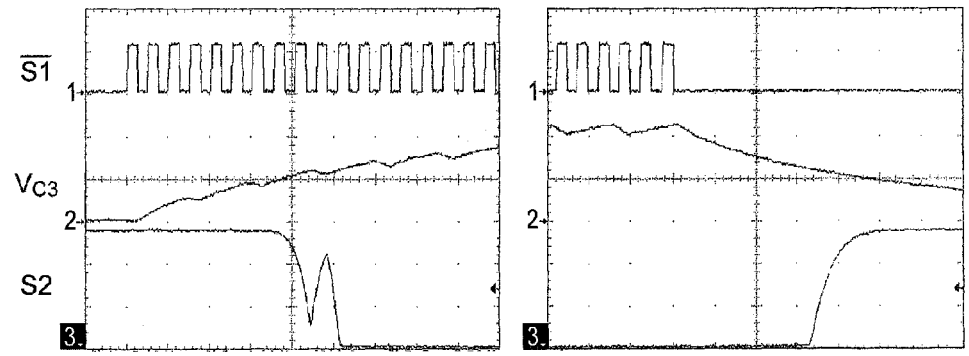
Figure 8C:
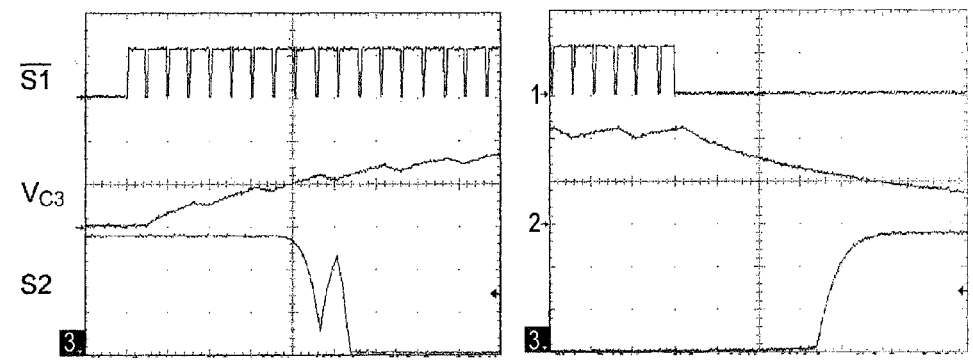

FIGS. 8A to 8C are waveform diagrams showing how the pulse input determining circuit 402c of FIG. 7 operates. FIGS. 8A to 8C show sets of waveforms that occur when the duty ratio of the turning-on/off instruction signal S1 is equal to 10%, 50%, and 90%, respectively. The pulse input determining circuit 402c of FIG. 7 can determine, irrespective of the duty ratio, as to whether or not the turning-on/off instruction signal S1 is in the turn-on state $\phi_{ON}$.

Figure 9:
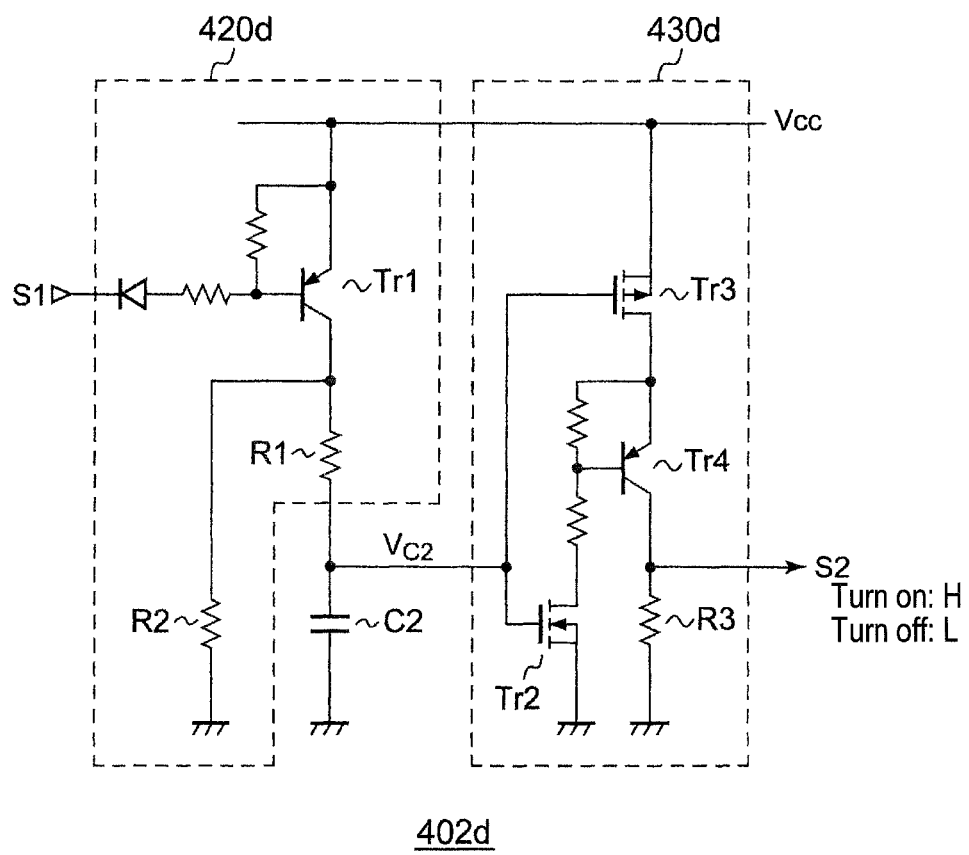
FIG. 9 is a circuit diagram of a pulse input determining circuit of a fourth example.

FIG. 9 is a circuit diagram of a pulse input determining circuit 402d of a fourth example. The pulse input determining circuit 402d has the same basic configuration as the pulse input determining circuit 402a of FIG. 4A. A charging/discharging circuit 420d charges the capacitor C2 in accordance with the turning-on/off instruction signal S1. More specifically, the charging/discharging circuit 420d charges the capacitor C2 when the turning-on/off instruction signal S1 is at a first level (e.g., low level). Also, the charging/discharging circuit 420d causes the capacitor C2 to discharge when the turning-on/off instruction signal S1 is at a second level (e.g., high level). The charging rate and discharge rate are defined so that the voltage $V_{C2}$ of the capacitor C2 is in a voltage range of Va to Vb (Va<Vb) when the turning-on/off instruction signal S1 is in pulse form. A determination section 430d asserts the determination signal S2 if the capacitor voltage $V_{C2}$ is in the voltage range of Va to Vb. Also, the determination section 430d negates the determination signal S2 if the capacitor voltage $V_{C2}$ is not in the voltage range of Va to Vb.

For example, the charging/discharging circuit 420d includes a transistor Tr1 and resistors R1, R2. When the turning-on/off instruction signal S1 is at the low level, the transistor Tr1 is on and the capacitor C2 is charged through the resistor R1. The charging rate is determined by the resistor R1 When the turning-on/off instruction signal S1 is at the high level, the transistor Tr1 is off and the capacitor C2 discharges through the resistors R1, R2. The discharge rate is determined by the resistors R1, R2.

For example, the charging rate and discharge rate may be defined so that the capacitor voltage $V_{C2}$ becomes close to the middle voltage $V_{CC}/2$ between the power source voltage $V_{CC}$ and the ground voltage $V_{GND}$ (=0 V) when the duty ratio of the turning-on/off instruction signal S1 is 50%.

The determination section 430d compares the capacitor voltage VC2 with the two threshold voltages Va and Vb. For example, the determination section 430d includes transistors Tr3, Tr4, a resistor R3, and a transistor Tr2.

Let $V_{GS(TH2)}$ and $V_{GS(TH3)}$ represent the gate-source threshold voltages of the transistors Tr2, Tr3, respectively.

When a relationship $V_{GS(TH2)} < V_{C2} < V_{CC} \, V_{GS(TH3)}$ holds, both of the transistors Tr2, Tr3 are on, the transistor Tr4 is on, and the determination signal S2 takes a high level $V_{CC}$). When $V_{C2} < V_{GS(TH2)}$, the transistor Tr2 is off and the transistor Tr3 is on, and the determination signal S2 takes a low level ($V_{GND}$). When $V_{CC} - V_{GS(TH3)} < V_{C2}$, the transistor Tr2 is on and the transistor Tr3 is off, and the determination signal S2 takes the low level. With this configuration, whether or not the capacitor voltage VC2 is in the voltage range of Va to Vb can be determined with the first voltage Va and the second voltage Vb being equal to $V_{GS(TH2)}$ and $V_{CC} - V_{GS(TH3)}$, respectively.

The determination section 430d may be a window comparator including two voltage comparators and a logic gate. The two voltage comparators compare the capacitor voltage $V_{C2}$ with the voltages Va and Vb. The logic gate performs a logic operation on output signals of the two voltage comparators.

Second Exemplary Embodiment

Figure 10:
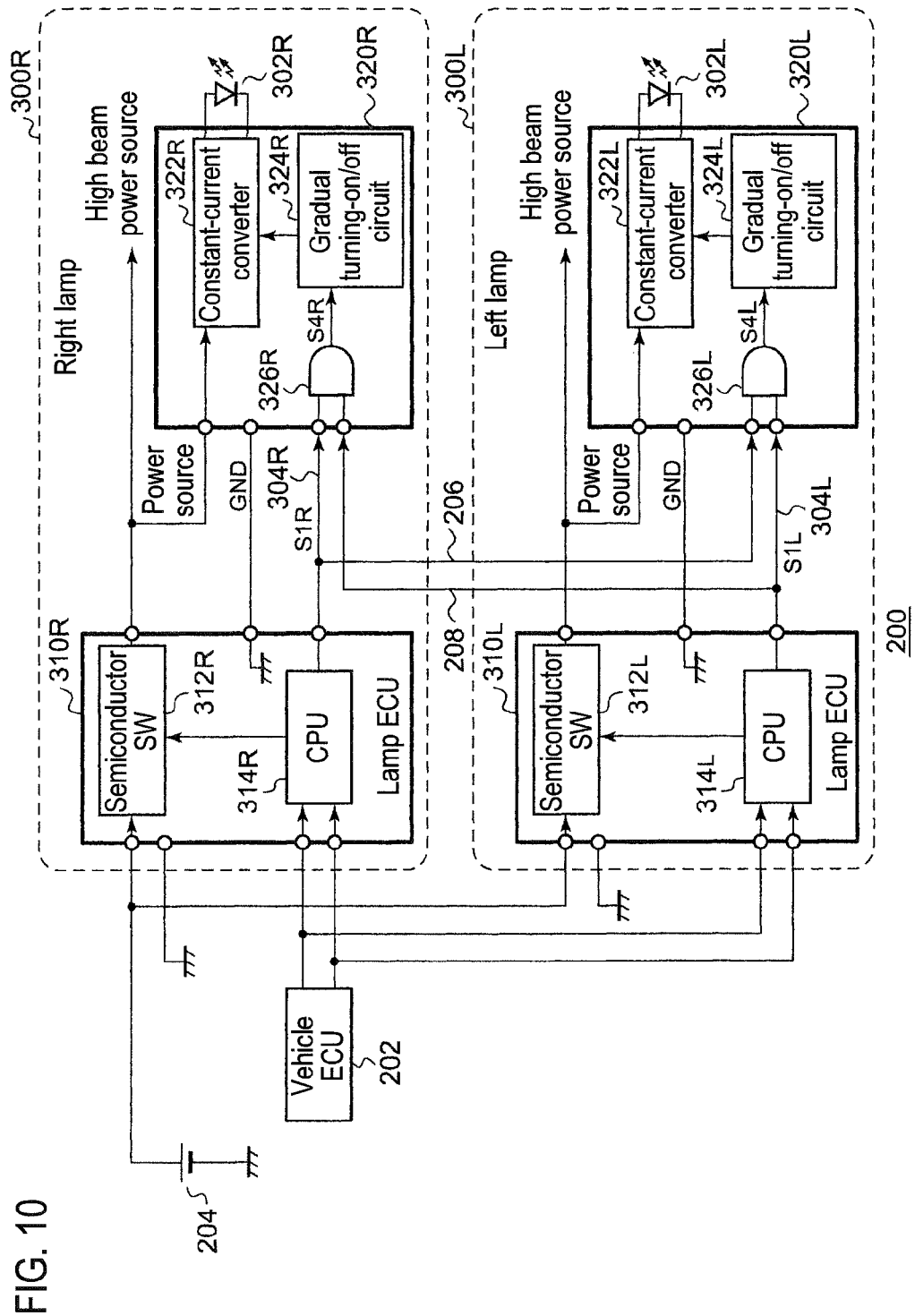
FIG. 10 is a block diagram of a lamp system according to a second exemplary embodiment.

FIG. 10 is a block diagram of a lamp system 200 according to a second exemplary embodiment. The lamp system 200 has the same basic configuration as the lamp system 1200 shown in FIG. 1. The lamp system 200 includes a vehicle ECU 202, a battery 204, a right lamp (vehicle lamp) 300R and a left lamp 300L. The right and left lamps 300R, 300L have similar configurations to each other.

Cross interconnections 206, 208 are provided between the right lamp 300R and the left lamp 300L. The cross interconnection 206 transmits a turning-on/off instruction signal S1R of the right lamp 200R to the left lamp 300L. Conversely, the cross interconnection 208 transmits a turning-on/off instruction signal S1L of the left lamp 200L to the right lamp 300R.

The lighting circuit 320R of the right lamp 300R turns on the semiconductor light source 302R when both of (i) the turning-on/off instruction signal S1R for the lighting circuit 320R and (ii) the turning-on/off instruction signal S1L, which is input through the cross interconnection 208, command turning-on. Likewise, the lighting circuit 320L of the left lamp 300L turns on the semiconductor light source 302L when both of (i) the turning-on/off instruction signal S1L for the lighting circuit 320L and (ii) the turning-on/off instruction signal S1R, which is input though the cross interconnection 206, command turning-on.

The lighting circuits 320R, 320L respectively include logic gates 326R, 326L that perform a logic operation on the turning-on/off instruction signals S1R, S1L. For example, in a platform in which the respective turning-on/off instruction signals S1R, S1L take a high level in commanding turning-on, the logic gates 326R, 326L may be implemented by AND gates. One skilled in the art would appreciate that the logical equation representing the logic gates 326R, 326L and the configuration of the logic gates 326R, 326L may be changed according to logic levels of the respective signals.

Output signals (determination signals) S4R, S4L of the logic gates 326R, 326L are asserted (e.g., the output signals S4R, S4L are at a high level) when both of the turning-on/off instruction signals S1R, S1L command turning-on. Gradual turning-on/off circuits 324R, 324L cause the constant-current converter 322R, 322L to start operating, when the determination signals S4R, S4L are started to be asserted.

Description on the configuration of the lamp system 200 has been completed. Then, how the lamp system 200 operates will be described below.

Figure 11:
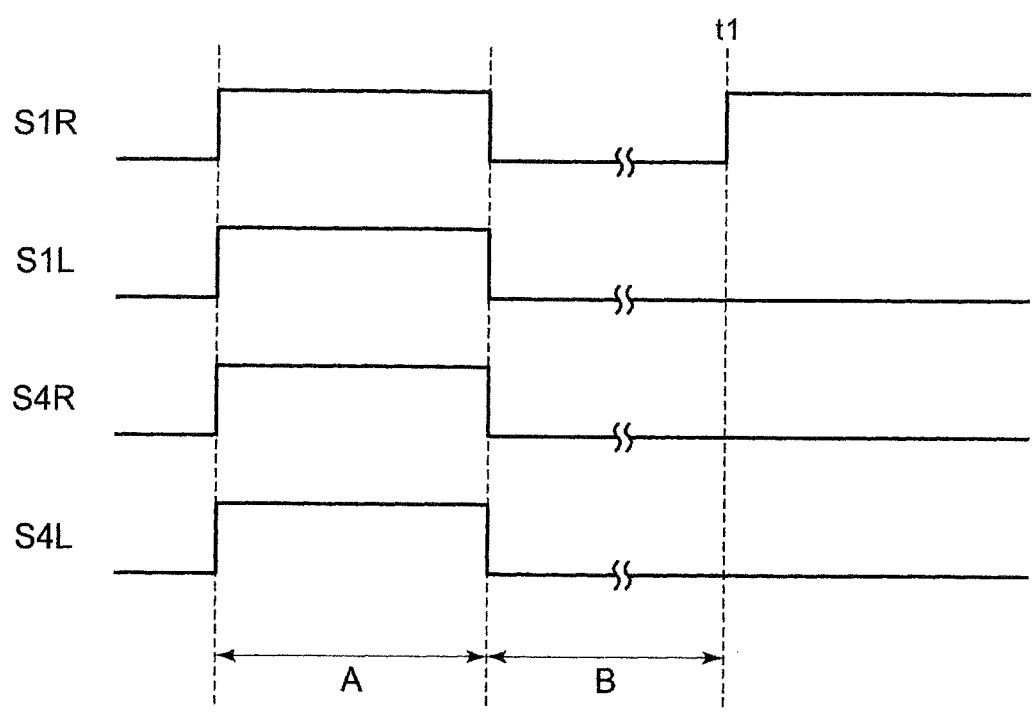
FIG. 11 is a waveform diagram illustrating how the lamp system of FIG. 10 operates.

FIG. 11 is a waveform diagram showing how the lamp system 200 of FIG. 10 operates. Before time t1, the signals line 304R, 304L are both in a normal state, and the turning-on/off instruction signals S1R, S1L are transmitted correctly. In interval A, to command turning-on the semiconductor light sources 302R, 302L, the CPUs 314R, 314L generate high-level turning-on/off instruction signals S1R, S1L, respectively. At this time, the output signals (determination signals) S4R, S4L of the logic gates 326R, 326L take the high level. The gradual turning-on/off circuits 324R, 324L increase drive currents $I_{LD}$ slowly to cause gradual turning-on. Then, the gradual turning-on/off circuits 324R, 324L stabilize the drive currents $I_{LD}$ and thereby keep the light quantities of the semiconductor light sources 302R, 302L constant.

In interval B, to command turning-off the semiconductor light sources 302R, 302L, the CPUs 314R, 314L generate low-level turning-on/off instruction signals S1R, S1L, respectively. As a result, the determination signals S4R, S4L take the low level, and the semiconductor light sources 302R, 302L are turned off gradually.

Assume that the signal line 304R suffers a high-side short-circuiting at the time t1. Upon the high-side short-circuiting of the signal line 304R, the turning-on/off instruction signal S1R, is fixed at the high-level voltage corresponding to the turning-on command. At this time, since the other turning-on/off instruction signal S1L is at the low level, the determination signals S4R, S4L of the right and left lamps 300R, 300L are kept at the low level. Therefore, both of the semiconductor light sources 302R, 302L are kept off.

As described above, the lamp system 200 according to the second exemplary embodiment is improved in safety because the semiconductor light sources 302R, 302L can be turned off when an abnormality such as a high-side short-circuiting, earthing, or a disconnection has occurred in any of the output signal lines of the processors 314R, 314L.

The lamp system 200 of FIG. 10 may be configured so that when the turning-on/off instruction signals S1R, S1L are in the turn-on state, the turning-on/off instruction signals S1R, S1L are in pulse form on, as in the first exemplary embodiment. In this case, the same pulse input determining circuits 402 as employed in the first exemplary embodiment may be disposed upstream of the logic gates 326R, 326L, respectively. In this case, the determination signals S2R, S2L are input to the logic gates 326R, 326L.

A common power source (not shown) is used as a power source for a high-beam lighting circuit and a power source for the additional high-beam lighting circuit 320. A semiconductor switch 312 of the lamp ECU 310 is disposed on a supply path of a battery voltage $V_{BAT}$ from the battery 204 to the lighting circuit 320. Each CPU 314 controls the turning-on/off of high beams and additional high beams by on/off-controlling the semiconductor switch 312 based on an instruction, vehicle speed information, etc. supplied from the vehicle ECU 202.

The invention has been described above by way of the exemplary embodiment using the specific terms. However, the exemplary embodiment merely shows the principle and applications of the invention. The exemplary embodiment can have various modifications and be changed in various manners in the arrangement of constituent elements without departing from the concept of the invention as defined by the claims.

What is claimed is:

1. A lighting circuit for turning on or off a semiconductor light source in accordance with a turning-on/off instruction signal from a processor, the lighting circuit comprising:
  a pulse input determining circuit that:
    receives, from the processor, the turning-on/off instruction signal which is in pulse form in commanding turning-on and which is at a constant level in commanding turning-off,
    determines as to whether or not the turning-on/off instruction signal is in a turn-on state in which the turning-on/off instruction signal is in pulse form, and
    generates a determination signal which is asserted if the turning-on/off instruction signal is in pulse form; and
  a drive circuit that:
    supplies the semiconductor light source with a drive current if the determination signal is asserted, and
    does not supply the semiconductor light source with the drive current if the determination signal is negated.

2. The lighting circuit according to claim 1,
wherein the pulse input determining circuit comprises:
  a capacitor,
  a charging/discharging circuit that:
    charges the capacitor or causes the capacitor to discharge in response to detection of an edge of the turning-on/off instruction signal, and
    causes the capacitor to discharge or charges the capacitor if no edge of the turning-on/off instruction signal is detected, and
  a determination section that determines as to whether the turning-on/off instruction signal indicates turning-on or turning-off, based on a result of comparison between a voltage of the capacitor and a predetermined threshold voltage.

3. The lighting circuit according to claim 2,
wherein the charging/discharging circuit comprises:
  an edge detection circuit that detects the edge of the turning-on/off instruction signal,
  a current source that supplies a current to the capacitor in accordance with an output of the edge detection circuit,
  a discharge path through which the capacitor discharges, and
  a comparison transistor that receives the voltage of the capacitor at a control terminal thereof.

4. The lighting circuit according to claim 1, wherein the pulse input determining circuit comprises a retriggerable monostable multivibrator that receives, at a trigger input terminal thereof, a trigger signal corresponding to the turning-on/off instruction signal.

5. The lighting circuit according to claim 1,
wherein the pulse input determining circuit comprises:
  an edge detection circuit that detects an edge of the turning-on/off instruction signal,
  a non-retriggerable monostable multivibrator that receives, at a trigger input terminal thereof, a trigger signal corresponding to an output of the edge detection circuit, and
  a low-pass filter that is disposed downstream of the non-retriggerable monostable multivibrator.

6. The lighting circuit according to claim 1,
wherein the pulse input determining circuit comprises:
  a capacitor,
  a charging/discharging circuit that:
    charges the capacitor when the turning-on/off instruction signal is at a first level, and
    causes the capacitor to discharge when the turning-on/off instruction signal is at a second level,
  a charging rate and a discharge rate being defined so that a voltage of the capacitor is between a first voltage) and a second voltage) when the turning-on/off instruction signal is in pulse form, and
  a determination section that:
    compares the voltage of the capacitor with the first voltage) and the second voltage), and
    determines as to whether the turning-on/off instruction signal indicates turning-on or turning-off, based on a result of the comparison.

7. A lamp system comprising:
a right lamp; and
a left lamp,
wherein each of the right and left lamps comprises:
  a semiconductor light source,
  a lamp ECU that generates a turning-on/off instruction signal for commanding turning-on or turning off of the semiconductor light source, and
  a lighting circuit that supplies a current to the semiconductor light source,
wherein the lighting circuit of the right lamp turns on the semiconductor light source of the right lamp if both of the turning-on/off instruction signal generated by the lamp ECU of the right lamp and the turning-on/off instruction signal generated by the lamp ECU of the left lamp command turning-on, and
wherein the lighting circuit of the left lamp turns on the semiconductor light source of the left lamp if both of the turning-on/off instruction signal generated by the lamp ECU of the left lamp and the turning-on/off instruction signal generated by the lamp ECU of the right lamp command turning-on.

8. The lighting circuit according to claim 1,
wherein the pulse input determining circuit generates a determination signal which is negated if the turning-on/off instruction signal is at the constant level.

9. A lighting circuit for turning on or off a semiconductor light source in accordance with a turning-on/off instruction signal from a processor, the lighting circuit comprising:
  a pulse input determining circuit that:
    receives, from the processor, the turning-on/off instruction signal which is in pulse form in commanding turning-on and which is at a constant level in commanding turning-off,
    generates a first signal if the turning-on/off instruction signal is in pulse form and a second signal if the turning-on/off instruction signal is at the constant level; and
  a drive circuit that:
    receives the first signal or the second signal from the pulse input determining circuit,
    supplies the semiconductor light source with a drive current if the first signal is received, and does not supply the semiconductor light source with the drive current if the second signal is received.

* * * * *